(12) United States Patent
Shelby

(10) Patent No.: US 8,737,849 B2
(45) Date of Patent: May 27, 2014

(54) ADDRESSING FOR A MEMORY DEVICE USED IN AN IMAGE RECORDING APPARATUS

(75) Inventor: Michael Larkin Shelby, Cary, NC (US)

(73) Assignee: Static Control Components, Inc., Sanford, NC (US)

( * ) Notice: Subject to any disclaimer, the term of this patent is extended or adjusted under 35 U.S.C. 154(b) by 372 days.

(21) Appl. No.: 13/098,953

(22) Filed: May 2, 2011

(65) Prior Publication Data

US 2012/0281993 A1 Nov. 8, 2012

(51) Int. Cl.
*G03G 15/00* (2006.01)
(52) U.S. Cl.
CPC .............. *G03G 15/55* (2013.01); *G03G 15/5075* (2013.01); *G03G 2215/00109* (2013.01)
USPC .............................................................. 399/8
(58) Field of Classification Search
CPC ....................................................... G03G 15/55
USPC ....................... 399/8, 109; 358/1, 14; 711/148
See application file for complete search history.

(56) References Cited

U.S. PATENT DOCUMENTS

| | | | |
|---|---|---|---|
| 6,882,810 B2 | 4/2005 | Karagiannis |
| 7,099,599 B2 | 8/2006 | Karagiannis |
| 7,099,606 B2 | 8/2006 | Karagiannis |
| 7,286,249 B2 | 10/2007 | Engel |
| 7,398,033 B2 | 7/2008 | Karagiannis |
| 7,426,613 B2 | 9/2008 | Booth |
| 7,596,329 B2 | 9/2009 | Burchette |
| 7,706,718 B2 | 4/2010 | Karagiannis |
| 7,844,786 B2 | 11/2010 | Booth |
| 2007/0250659 A1 | 10/2007 | Booth |
| 2008/0276048 A1 | 11/2008 | Booth |

*Primary Examiner* — Clayton E Laballe
*Assistant Examiner* — Kevin Butler

(57) ABSTRACT

Many devices, such as printers, work with one or more removable unit. Often, the removable units have an electronic circuit that used to communicate with the device. It may be desirable to provide a replacement unit in these devices. The replacement unit must include an electronic circuit that is able to communicate with the original device. Disclosed is a method and apparatus where a replacement unit is provided with a new electronic circuit and a used electronic circuit. The new electronic circuit is electrically connected to the used electronic circuit and uses the used electronic circuit to facilitate communication with the host device.

28 Claims, 2 Drawing Sheets

US 8,737,849 B2

ADDRESSING FOR A MEMORY DEVICE USED IN AN IMAGE RECORDING APPARATUS

BACKGROUND

Many electronic devices have components that include an integrated memory. Often, the manufacturer of these devices wants to monitor usage to determine a remaining life of the device. One example of these devices is a printer having a memory on a printing cartridge.

The host device must be able to communicate with the memory in order to receive the information stored in the memory device and to command updating of the information stored in the memory device.

U.S. Pat. No. 7,844,786 discloses addressing and command protocols for addressing an electronic circuit having a non-volatile memory. As shown in FIG. 1, the processing device 101 controls a voltage regulator 102 that provides a voltage source 104 to the memory modules 103a, 103b, ... 103x that are also provided with a common ground reference 106. The processing device 101 may exchange data with one or more of the non-volatile memory modules 103a, 103b, ... 103x through an address/data channel 108. The controlling computer system 101 may also provide a common time reference to the memory modules 103a, 103b, ... 103x through a clock channel 121. A conductor 114 with a set of discrete voltage levels is provided through the use of resistors 118, and where each discrete voltage level corresponds to a particular bit position in the memory module address.

This patent discloses that a busy/available status may be provided on the first channel by effectively "anding" the busy/available output signals from each of the memory modules through the use of an open-collector/open-drain 112. The open-collector/open-drain 112 may include one or more common resistors and one or more capacitors. In such a configuration, each memory module 103a, 103b, ... 103x may output a high voltage signal if it is able to accept a command, or a low voltage signal if it is busy executing a command. Thus, if all of the memory modules 103a, 103b, ... 103x are available, then the first channel signal may be pulled up to a "high" voltage by the resistor in the open-collector/open-drain 112, signifying that all of the memory modules 103a, 103b, ... 103x are available.

This patent also teaches that if any memory module 103a, 103b, ... 103x is busy, then the first channel signal may be pulled to a "low" voltage close to ground by the open-collector/open-drain 112. If at least one memory module 103a, 103b, ... 103x is busy, the processing device 101 may wait until the first channel signal is pulled to a high voltage level before issuing a subsequent command to the memory modules 103a, 103b, ... 103x. In this manner, the processing device 101 may synchronize the memory modules 103a, 103b, ... 103x before issuing a common command, such as an increment counter command, to a plurality of the memory modules 103a, 103b, ... 103x. Similarly the second channel may also effectively "and" the error/no-error output signals from each of the memory modules. This may also be provided with another open-collector/open-drain 112 having a common resistor and capacitor.

Each of the memory modules 103a, 103b, ... 103x may output a high voltage signal on the second channel when there is no error detected and a low voltage signal if an error is detected. Thus, if one of the memory modules 103a, 103b, ... 103x has an error, the second channel may be pulled to a low voltage by the open-collector/open-drain 112, signifying that at least one memory module 103a, 103b, ... 103x contains an error. If all of the memory modules 103a, 103b, ... 103x are error-free, then the second channel may be pulled to a high voltage. All of the memory modules 103a, 103b, ... 103x will be ready and error-free if the first and second channels are at a high voltage level. It will be appreciated by one of ordinary skill that there are many alternatives to the "anding" function of open-collector/open drain 112 discussed above. For example, a plurality of physical "and" gates can be used instead of the open-collector/open-drain 112.

The status channel 110 may include only a single channel capable of representing the ready, error, and busy states for the memory modules 103a, 103b, ... 103x. When only a single channel is used, all addressed memory modules 103a, 103b, ... 103x may release their respective busy signals from a low voltage level to a high voltage level after each finishes processing its current command. The status channel 110 may then be pulled to a high voltage level by the open-drain/open-collector 112. Once the addressed memory modules 103a, 103b, ... 103x have completed their commands and released each of their output signals above the low voltage, any memory module that needs to report an error may hold the status channel 110 at an intermediate voltage level that is higher than the low voltage level (e.g., close to ground) but lower than the high voltage (e.g., approximately 3.3V). For instance, each of the memory modules 103a, 103b, ... 103x may use a 1.5V Zener diode component to ground to provide the intermediate voltage level. Other methods of providing an intermediate voltage levels may alternatively be implementing using resistors, as is known in the art, such as using a 5.1 KOhms resistance to ground to provide the intermediate voltage level. In this way, a single status channel 110 may be sufficient for reporting the ready, error, and busy states of the memory modules 103a, 103b, ... 103x thereby reducing the electrical connections required between the processing device 101 and the memory modules 103a, 103b, ... 103x.

A disadvantage of to the above addressing scheme is that it requires additional elements to provide three voltage levels at one channel.

SUMMARY

The present device and methods allows for a device having a memory to be remanufactured and to allow the remanufactured device to properly communicate with a host device.

One method is for communicating between an electronic circuit located on a replaceable unit and a host device. The method includes providing a replaceable unit for use in a host device, providing a first electronic circuit on the replaceable unit, and providing a second electronic circuit on the replaceable unit, wherein the second electronic circuit is in communication with the first electronic circuit. A signal is received from the host device at the replaceable unit. Information is received from the first electronic circuit at the host device. The host device reads three levels from the replaceable unit, the first electronic circuit provides two levels to the host device and the second electronic circuit provides a third level to the host device. The first electronic circuit indicates two levels by using a high level voltage and a low voltage and the second electronic circuit indicates a third level by using a middle voltage level.

One embodiment describes an image recording device having a replaceable unit for use in the image recording device. A first electronic circuit is located on the replaceable unit and a second electronic circuit located on the replaceable unit, wherein the second electronic circuit is in communication with the first electronic circuit. An interface receives a signal from the host device at the first electronic circuit, wherein information from the first electronic circuit is indicated to the image recording device by reading three levels from the interface, and the first electronic circuit provides two levels to the host device and the second electronic circuit provides a third level to the host device.

In another method a first electronic circuit is provided and a second electronic circuit is acquired, wherein the second electronic circuit has been previously used. The first electronic circuit is mounted on a first substrate and the second electronic is mounted on a second substrate and the first electronic circuit is electrically connected to the second circuit. The first substrate and the second substrate may be the same substrate or they may be different substrates. Alternatively, one of the electronic circuits may be mounted directly on top of the other electronic circuit.

The methods and apparatuses above allow for an electronic circuit to communicate to a host device by using multiple voltage levels. This allows the electronic circuit to communicate a larger amount of information to the host device.

Another advantage is that a consumable device having a memory mounted therein can be reused when the memory has been damaged or disabled. The recovered memory from the consumable device can be electronically connected to another chip having a memory device. The chip can communicate to the host using two voltage levels and use the recovered memory to provide a third voltage level.

These and other features and objects of the invention will be more fully understood from the following detailed description of the embodiments, which should be read in light of the accompanying drawings.

In this regard, before explaining at least one embodiment of the invention in detail, it is to be understood that the invention is not limited in its application to the details of construction and to the arrangements of the components set forth in the description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be used as a basis for designing other structures, methods, and systems for carrying out the several purposes of the present invention. It is important, therefore, that the claims be regarded as including such equivalent constructions insofar as they do not depart from the spirit and scope of the present invention.

BRIEF DESCRIPTION OF THE DRAWINGS

The accompanying drawings, which are incorporated in and form a part of the specification, illustrate embodiments of the present invention and, together with the description, serve to explain the principles of the invention.

DETAILED DESCRIPTION OF THE DRAWINGS

Figure 1:
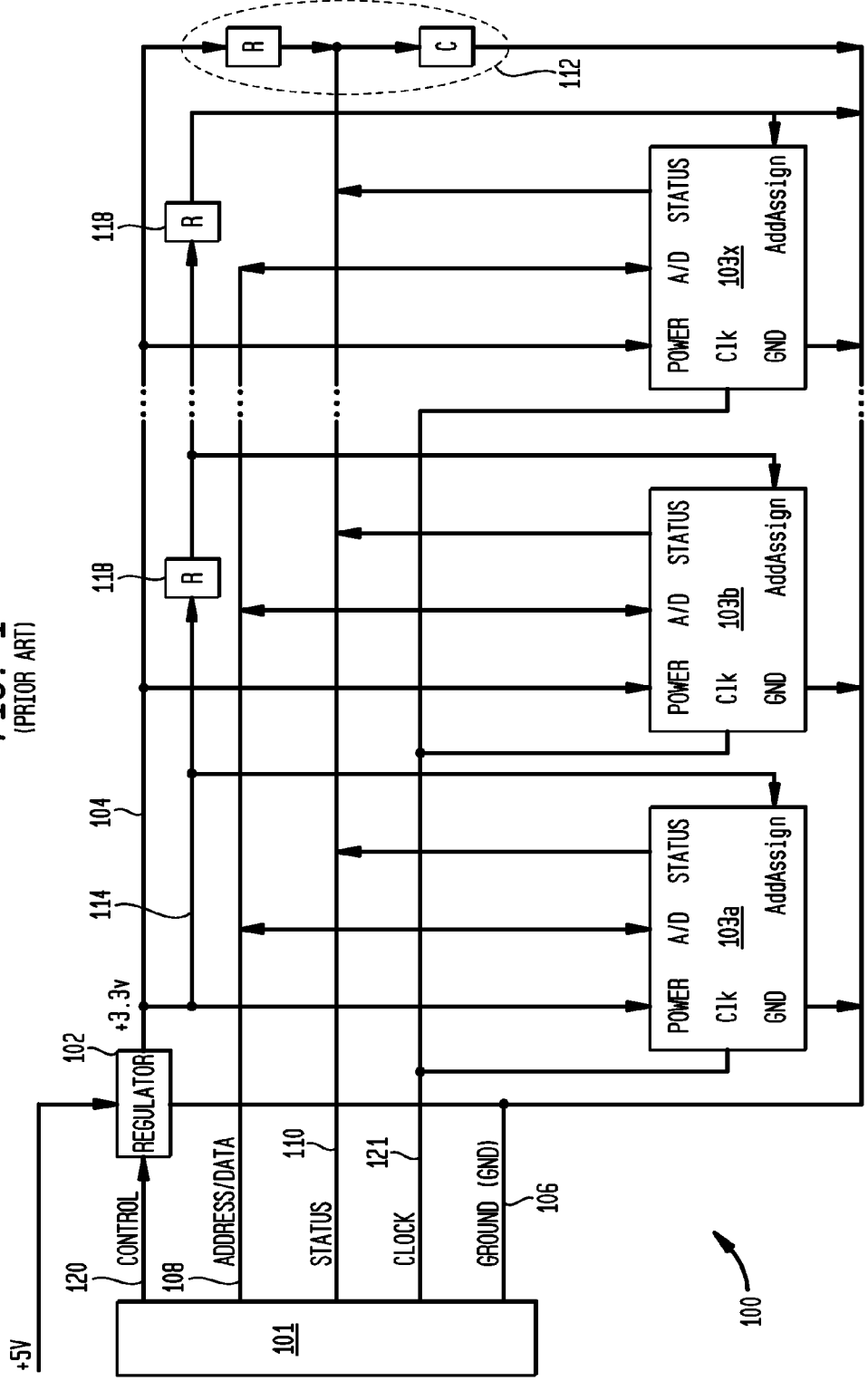
FIG. 1 illustrates a prior art electrical interface for communication between a processor and multiple memory devices.

In describing an embodiment of the invention illustrated in the drawings, specific terminology will be used for the sake of clarity. However, the invention is not intended to be limited to the specific terms so selected, and it is to be understood that each specific term includes all technical equivalents which operate in a similar manner to accomplish a similar purpose.

Figure 2:
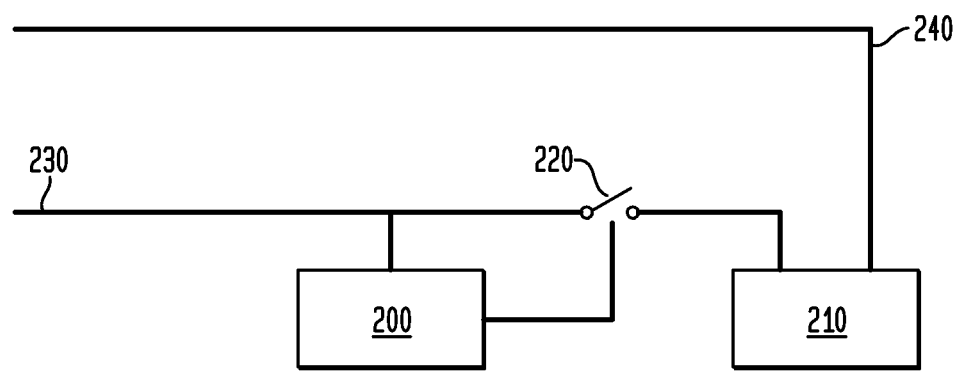
FIG. 2 illustrates an embodiment where two electronic circuits are connected via a switch.

FIG. 2 illustrates an embodiment where two electronic circuits are connected via a switch. Electronic circuit 200 is connected to electronic circuit 210 via switch 220. Electronic circuit 200 communicates with the host device via an address channel 230. Electronic circuit 200 is configured to communicate to the host device with two voltage levels, a high voltage level and a low voltage level. The high voltage may be any desired voltage level but in a preferred embodiment is set to 5 volts. The low level may be any desired lower level but in a preferred embodiment is set to 0 volts. Electronic circuit 200 also communicates to the host via a status channel 240. The status channel can be used to indicate that the electronic circuit 200 is busy or that an error has occurred. When electronic circuit 200 is communicating with the host device and is busy or in an error state, electronic circuit 200 needs to communicate using a medium voltage level. The switch 220 is activated connecting electronic 210 to electronic circuit 200. This brings the high voltage level (for example 5 volts) down to medium voltage level. The medium voltage level may be set to any level that is between the high voltage level and the low voltage level. In a preferred embodiment the medium voltage level is set to 3.3 volts. By connecting electronic circuit 200 to electronic circuit 210 via the switch 220 the electronic circuit 200 is able to communicate with the host device using three voltage levels without the need to provide any complicated circuitry to generate all three voltage levels.

In one embodiment, electronic circuit 210 is an electronic circuit located on a printer cartridge. Typically printer cartridges, in both electrostatic printers and inkjet printers, are removable and replaceable. Printer cartridges often have an electronic circuit that communicates with a processor or other electronic device located within the printer. Often, the electronic circuit 210 contains one or more memory locations storing information that enables the printer cartridge to operate within the printer. This information may include a serial number, a print material level indication, an authentication code, or any other desired information.

It is desirable to be able to reuse, refill, or remanufacture the print cartridge in order to save resources and reduce waste, but, many printer manufactures store information in the electronic circuit 210 in a manner that prevents reusing the printer cartridge. For example, the electronic circuit 210 may contain information that the print cartridge has been previously used and is not authorized for reuse. Electronic circuit 200 is a replacement circuit that can be used on a remanufactured or recycled device in place of electronic circuit 210. Electronic circuit 200 can contain everything necessary and all of the information that was originally located in electronic circuit 210. This allows the printer cartridge to be reused and remanufactured.

Figure 3:
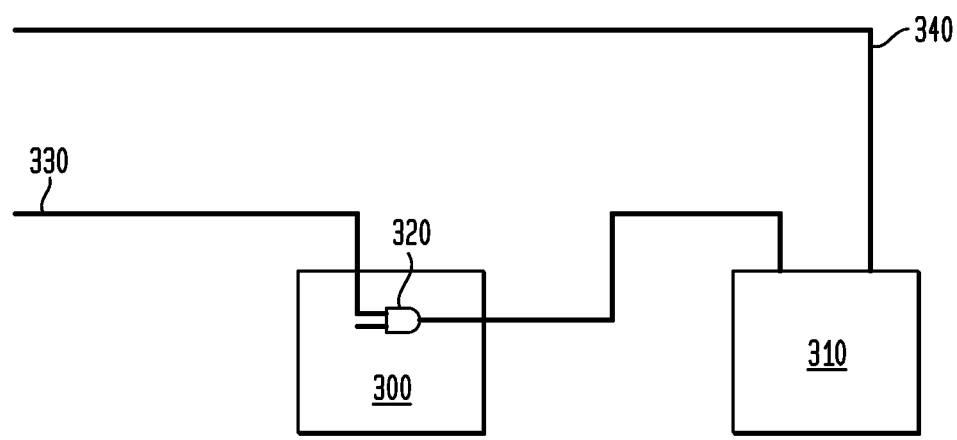
FIG. 3 illustrates an embodiment where the two electronic circuits are connected without a switch.

FIG. 3 illustrates an embodiment where two electronic circuits are in electrical communication without using a switch. Electronic circuit 300 is connected to electronic circuit 310 without using a switch. Electronic circuit 300 contains internal logic 320 in place of a switch. Electronic circuit 300 communicates with the host device via an address channel 330. Electronic circuit 300 is configured to communicate to the host device with two voltage levels, a high voltage level and a low voltage level. The high voltage may be any desired voltage level but in a preferred embodiment is set to 5 volts. The low level may be any desired lower level but in a preferred embodiment is set to 0 volts. Electronic circuit 300 also communicates to the host via a status channel 340. The status channel can be used to indicate that the electronic circuit 300 is busy or that an error has occurred. When electronic circuit 300 is communicating with the host device and is busy or in an error state, electronic circuit 300 needs to communicate using a medium voltage level. The internal logic 320 is causes activation of electronic circuit 310. This brings the high voltage level (for example 5 volts) down to medium voltage level. The medium voltage level may be set to any level that is between the high voltage level and the low voltage level. In a preferred embodiment the medium voltage level is set to 3.3 volts. By connecting electronic circuit 300 to electronic circuit 310 via the internal logic 320 the electronic circuit 300 is able to communicate with the host device using three voltage levels without the need to provide any complicated circuitry to generate all three voltage levels.

Although internal logic 320 is illustrated as an AND gate any desired digital logic circuitry can be used. Also, an operational amplifier or transistor may be used as an internal device that controls activation of electronic circuit 310.

The many features and advantages of the invention are apparent from the detailed specification. Thus, the appended claims are intended to cover all such features and advantages of the invention which fall within the true spirits and scope of the invention. Further, since numerous modifications and variations will readily occur to those skilled in the art, it is not desired to limit the invention to the exact construction and operation illustrated and described. Accordingly, all appropriate modifications and equivalents may be included within the scope of the invention.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed is:

1. A method for communicating between an electronic circuit located on a replaceable unit and a host device, the method comprising:
   providing a replaceable unit for use in a host device;
   providing a first electronic circuit on the replaceable unit;
   providing a second electronic circuit on the replaceable unit, wherein the second electronic circuit is in communication with the first electronic circuit via a switch or a logic gate;
   receiving a signal from the host device at the replaceable unit; and
   receiving information from the first electronic circuit at the host device; wherein the host device reads three levels from the replaceable unit, the first electronic circuit provides two levels to the host device and the second electronic circuit provides a third level to the host device.

2. The method of claim 1, wherein the first electronic circuit indicates two levels by using a first voltage level and a second voltage level.

3. The method of claim 1, wherein the second electronic circuit indicates one level by using a third voltage level.

4. The method of claim 1 further comprising:
   providing the switch between the first electronic circuit and the second electronic circuit; and
   controlling the switch to activate communication with the second electronic circuit when it is desired to indicate a specific level.

5. The method of claim 1, wherein the host device is an image recording device and the replaceable unit is a consumable cartridge.

6. The method of claim 5, wherein the second electronic circuit is a chip that was provided by the original equipment manufacturer of the consumable cartridge.

7. The method of claim 5, wherein the consumable cartridge is an ink cartridge or a toner cartridge.

8. The method of claim 5, wherein the first electronic circuit includes at least one memory device.

9. The method of claim 8, wherein the memory device stores information about the consumable cartridge.

10. The method of 1, wherein the information is a status of the first electronic circuit or the second electronic circuit.

11. An image recording device comprising:
    a replaceable unit for use in the image recording device;
    a first electronic circuit located on the replaceable unit;
    a second electronic circuit located on the replaceable unit, wherein the second electronic circuit is in communication with the first electronic circuit via a switch or a logic gate; and
    an interface for receiving a signal from the host device at the first electronic circuit, wherein information from the first electronic circuit is indicated to the image recording device by reading three levels from the interface, and the first electronic circuit provides two levels to the host device and the second electronic circuit provides a third level to the host device.

12. The image recording device of claim 11, wherein the first electronic circuit indicates two levels by using a high level voltage and a low voltage.

13. The image recording device of claim 11, wherein the second electronic circuit indicates one level by using a middle level voltage.

14. The image recording device of claim 11, wherein the switch is located on the replaceable unit between the first electronic circuit and the second electronic circuit, wherein the switch is controlled to activate communication with the second electronic circuit when it is desired to indicate a specific level.

15. The image recording device of claim 11, wherein the replaceable unit is a consumable cartridge.

16. The image recording device of claim 15, wherein the second electronic circuit is a chip that was provided by the original equipment manufacturer of the consumable cartridge.

17. The image recording device of claim 16, wherein the consumable cartridge is an ink cartridge or a toner cartridge.

18. The image recording device of claim 11, wherein the first electronic circuit includes at least one memory device.

19. The image recording device of claim 18, wherein the memory device stores information about the consumable cartridge.

20. The image recording device of claim 11, wherein the logic gate is an AND gate located in the first electronic circuit and the second electronic circuit, wherein the AND gate is controlled to activate communication with the second electronic circuit when it is desired to indicate a specific level.

21. The image recording device of claim 11, wherein the information includes status information of the first electronic circuit.

22. A method comprising:
    providing a first electronic circuit;
    acquiring a second electronic circuit, wherein the second electronic circuit has been previously used;
    mounting the first electronic circuit on a first substrate;
    mounting the second electronic circuit on a second substrate; and
    electrically connecting the first electronic circuit to the second electronic circuit, wherein the first electronic circuit is electronically connected to the second electronic through a switch or a logic gate.

23. The method of claim 22, wherein the first substrate and the second substrate are different substrates.

24. The method of claim 22, wherein the first substrate and the second substrate are different portions of the same substrate.

25. The method of claim 22, wherein the first electronic circuit is electronically connected to the second electronic circuit through the switch.

26. The method of claim 22, wherein the first electronic circuit has the logic gate and the logic gate is used to control the connection to the second electronic circuit.

27. The method of claim 22, wherein the first electronic circuit is capable of outputting two voltage levels and the second electronic circuit is used to output a third voltage level.

28. The method of claim 27, wherein the third voltage level is between the two voltage levels.

* * * * *